United States Patent Office 3,734,729
Patented May 22, 1973

3,734,729
DEEP ETCH PRINTING PLATES

Rexford W. Jones and William B. Thompson, Columbus, Ohio, assignors to A. E. Staley Manufacturing Company, Decatur, Ill.

No Drawing. Continuation-in-part of applications Ser. No. 796,897, Feb. 5, 1969, now abandoned, Ser. No. 833,771, June 16, 1969, now Patent No. 3,677,759, Ser. No. 849,520, Aug. 12, 1969, now abandoned, and Ser. No. 123,084, Mar. 10, 1971. This application Sept. 27, 1971, Ser. No. 184,252
Int. Cl. G03c *5/00*
U.S. Cl. 96—36.3 10 Claims

ABSTRACT OF THE DISCLOSURE

Method of forming a deep etch lithographic plate which comprises the steps of exposing a hydrophilic metal substrate bearing a light-sensitive layer capable of developing a $R_d$ of 1.0 to 2.2 to actinic radiation to produce a potential $R_d$ of 1.0 to 2.2; developing said light-sensitive layer with water-insoluble powder particles using physical force to embed the powder particles in the light-sensitive layer; removing non-embedded powder particles; fusing the water-insoluble powder particles to the hydrophilic metal substrate by heating; etching the hydrophilic metal substrate in the areas unprotected by the fused water-insoluble powder particles; applying a film forming, aromatic hydrocarbon insoluble, hydrophobic polymer to the plate from a poor solvent for the fused powder particles; and removing the fused powder particles and hydrophobic polymer adhering thereto with a poor solvent for said hydrophobic polymer.

This application is a continuation-in-part of applications Ser. Nos. 796,897, now abandoned; 833,771, now U.S. Pat. 3,677,759; 849,520, now abandoned, and 123,084 filed Feb. 5, 1969; June 16, 1969; Aug. 12, 1969 and Mar. 10, 1971 respectively.

This invention relates to a method of producing lithographic printing plates. More particularly, this invention relates to a method of making negative-acting, deep etch, lithographic printing plates.

Until recently, a very high percentage of long run lithographic printing plates have been produced by the so-called deep etch process. While this process produces lithographic printing plates suitable for printing approximately 500,000 to 600,000 impressions, it has the disadvantages that it is extremely time consuming, commonly taking from one to two hours to produce each printing plate, requires meticulous care at each step of the process to preserve the temporary resist (sometimes called the stencil), which is usually produced by exposing a dichromated colloid to light, and requires the use of a positive transparency. While the tanned dichromated colloid, or in some cases exposed diazo resins, are sufficiently hydrophobic that they may form the image areas of conventional lithographic printing plates, they are relatively water-sensitive in the sense that they swell or are dissolved in aqueous treating baths unless appropriate steps are taken to preserve their integrity.

In a typical situation, a deep etch printing plate is prepared by applying a dichromated colloid to a hydrophilic metal base, such as aluminum or zinc, and exposing the dichromated colloid to actinic radiation through a positive transparency thereby tanning the dichromated colloid in the exposed areas forming a temporary resist or stencil. The unexposed dichromated colloid is removed from the metal base by carefully soaking and scrubbing the imaged plate in an aqueous bath containing salts to prevent the tanned dichromated colloid from dissolving.

Then it is washed in anhydrous alcohol to remove the salts from the plate. The unprotected areas of the plate are etched by placing the metal plate in a suitable acidic bath containing additional salts to prevent the tanned dichromated colloid from dissolving. The plate is washed with alcoholic solutions to remove etching sludge from the aluminum. The etched areas are usually copperized by placing the plate in an alcoholic bath to prevent the tanned dichromated colloid from dissolving. The plate is carefully dried and lacquered with a hydrophobic resinous film to convert the temporarily hydrophilic copperized areas or exposed hydrophilic metal substrate, when the copperizing step is omitted, into hydrophobic areas. The tanned dichromated colloid is then removed from the lithographic plate together with lacquer adhering to the temporary dichromated resist by soaking in an aqueous bath. It is readily apparent that this is an extremely time consuming process and it would be desirable to provide a method of producing deep etch printing plates using a water-insoluble stencil.

The principal object of this invention is to provide a new method of producing deep etch printing plates. A second object of this invention is to provide a rapid method of producing deep etch printing plates. Another object of this invention is to provide a method of producing deep etch printing plates from negative masters. Other objects will appear hereinafter.

In the description that follows, the phrase "powder-receptive, solid, light-sensitive organic layer" is used to describe an organic layer which is capable of developing a predetermined contrast or reflection density ($R_d$) upon exposure to actinic light and embedment of black powder particles of a predetermined size in a single stratum at the surface of said organic layer. While explained in greater detail below, the $R_d$ of a light-sensitive layer is a photometric measurement of the difference in degree of blackness of undeveloped areas and black powder developed areas. Th e terms "physically embedded" or "physical force" are used to indicate that the powder particle is subject to an external force other than, or in addition to, either electrostatic force or gravitational force resulting from dusting or sprinkling powder particles on a substrate. The terms "mechanically embedded" or "mechanical force" are used to indicate that the powder particle is subjected to a manual or machine force, such as lateral to-and-fro or circular rubbing or scrubbing action. The term "embedded" is used to indicate that the powder particle displaces at least a portion of the light-sensitive layer and is held in the depression so created, i.e. at least a portion of each particle is below the surface of the light-sensitive layer.

We have now found that the objects of this invention can be attained by:

(1) exposing a hydrophilic metal substrate bearing a light-sensitive layer capable of developing a $R_d$ of 1.0 to 2.2 to actinic radiation to produce a potential $R_d$ of 1.0 to 2.2;
(2) developing said light-sensitive layer with water-in soluble, powder particles using physical force to embed the powder particles in the light-sensitive layer;
(3) removing non-embedded powder particles;
(4) fusing the water-insoluble powder particles to the hydrophilic metal substrate by heating;
(5) etching the hydrophilic metal substrate in the areas unprotected by the fused water-insoluble powder particles;
(6) applying a film-forming hydrophobic polymer to the plate from a poor solvent for the fused powder particles; and
(7) removing the fused powder particles and hydrophobic polymer adhering thereto with a poor solvent for said hydrophobic polymer.

Since the resist or stencil employed in this invention is water-insoluble, it is unnecessary to use salts or other measures to protect the resist during the removal of the unexposed dichromated colloid, or during the etching and copperizing steps. Typically a deep etch plate can be produced by this process in 15 to 30 minutes. By suitable choice of light-sensitive layer it is possible to produce deep etch plates using either positive masters or negative masters. Negative transparencies are employed with positive-acting, light-sensitive layers and positive transparencies are used with negative-acting, light-sensitive layers.

For the purposes of this invention, it is essential that (1) the developing powder is water-insoluble, (2) the hydrophobic film former is applied from a poor solvent for the fused developing powder and (3) the fused developing powder is removed with a poor solvent for the hydrophobic film. If the developing powder is not water-insoluble, the process of forming a deep etch plate will have all the disadvantages of the prior art methods, namely the requirement that the stencil or temporary resist be protected in every step of the process. If the hydrophobic film former is not applied from a poor solvent for the fused water-insoluble powder, the fused developing powder will dissolve and the temporary resist or stencil will be destroyed prematurely. If the fused developing powder bearing a hydrophobic film is not removed with a poor solvent for the hydrophobic film, the hydrophobic film may be removed from the copper image areas.

In somewhat greater detail a typical method of forming a deep etch plate according to the principles of this invention comprises exposing a hydrophilic metal substrate bearing a light-sensitive layer capable of developing a $R_d$ of 1.0 to 2.2 to actinic radiation to establish a potential $R_d$ of 1.0 to 2.2, physically embedding shellac powder particles into the unexposed areas of the light-sensitive layer; fusing the shellac powder particles to the surface of the light-sensitive layer and metal substrate by heating at an appropriate temperature; etching the unprotected areas of the metal plate in a suitable etching bath, generally aqueous; copperizing the etched areas of the metal surface in a suitable copper salt bath; applying a vinyl chloride-vinyl acetate lacquer from a methyl ethyl ketone solvent to the surface of the plate, whereby the vinyl chloride-vinyl acetate lacquer adheres to both the copperized areas and the fused shellac areas; and removing the fused shellac particles and vinyl chloride-vinyl acetate film adhering to the shellac particles from the metal surface with isopropanol. As indicated above, this process takes approximately 15 to 30 minutes as opposed to the prior art techniques which require from one to two hours. The powder particles (shellac particles) are water-insoluble, the hydrophobic film forming polymer is applied from a non-solvent (methyl ethyl ketone) for the fused shellac and the fused shellac particles are removed with a poor solvent (isopropanol) for the hydrophobic film adhering to the copperized image areas. If desired, the shellac developing powder can be replaced with Pliolite VTL (vinyltoluene-butadiene copolymer). In this case, the hydrophobic film forming polymer (vinyl acetate-vinyl chloride) is preferably applied from an aqueous emulsion and the fused developing powder removed with a mixture of 90 parts of Chlorothene (1,1,1-trichloroethane) and 10 parts water, a poor solvent for the vinyl chloride-vinyl acetate polymer. Accordingly, by suitable choice of water-insoluble developing powder, solvent for depositing the film forming hydrophobic polymer and solvent for removing the fused water-insoluble developing powder, it is possible to employ a wide variety of processing chemicals.

For use in this invention, the solid, light-sensitive organic layer, which can be an organic material in its naturally occurring or manufactured form or a mixture of said organic material with plasticizers and/or photoactivators for adjusting the powder receptivity and sensitivity to actinic radiation, must be capable of developing a predetermined contrast or $R_d$ using a suitable black developing powder under the conditions of development. The powder-receptive areas of the layer (unexposed areas of a positive-acting, light-sensitive layer or the exposed areas of a negative-acting material) must have a softness such that suitable particles can be embedded into a stratum at the surface of the light-sensitive layer by mild physical forces. However, the layer should be sufficiently hard that film transparencies can be pressed against the surface without the surfaces sticking together or being damaged even when heated slightly under high intensity light radiation. The light-sensitive layer should also have a degree of toughness so that it maintains its integrity during development. If the $R_d$ of the light-sensitive layer is below about 1.0, the light-sensitive layer is too hard to accept a suitable concentration of particles to produce a resist suitable for producing a full range printing plate. On the other hand, if the $R_d$ is above about 2.2, the light-sensitive layer is so soft that it is difficult to maintain film integrity during physical development. Further, if the $R_d$ is above 2.2, the light-sensitive layer is so soft that the layer may be displaced by mechanical forces resulting in distortion or destruction of the image. Accordingly, for use in this invention the light-sensitive layer must be capable of developing a $R_d$ within the range of 1.0 to 2.2 using a suitable black developing powder under the conditions of development.

The $R_d$ of the positive-acting, light-sensitive layer, which can be called $R_{dp}$, is a photometric measurement of the reflection density of a black powder developed light-sensitive layer after a positive-acting, light-sensitive layer has been exposed to sufficient actinic radiation to convert the exposed areas into a substantially powder-non-receptive state (clear the background). The $R_d$ of a negative-acting, light-sensitive layer, which is called $R_{dn}$, is a photometric measurement of the reflection density of a black powder developed area, after a negative-acting, light-sensitive layer has been exposed to sufficient radiation to convert the exposed area into a powder-receptive area.

In somewhat greater detail, the reflection density of the solid, positive-acting, light-sensitive layer ($R_{dp}$) is determined by coating the light-sensitive layer on a white substrate, exposing the light-sensitive layer to sufficient actinic radiation image-wise to clear the background of the solid, positive-acting, light-sensitive layer, applying a black powder (prepared from 77% Pliolite VTL and 23% Neo Spectra carbon black in the manner described below) to the exposed layer, physically embedding said black powder under the conditions of development as a monolayer in a stratum at the surface of said light-sensitive layer and removing the non-embedded particles from said light-sensitive layer. The developed organic layer containing black powder embedded image areas and substantially powder free non-image areas is placed in a standard photometer having a scale reading from 0 to 100% reflection of incident light or an equivalent density scale, such as on Model 500A photometer of the Photovolt Corporation. The instrument is zeroed (0 density; 100% reflectance) on a powder free-non-image area of the light-sensitive organic layer and an average $R_d$ reading is determined from the powder developed area. The reflection density is a measure of the degree of blackness of the developed surface which is relatable to the concentration of particles per unit area. The reflection density of a solid, negative-acting, light-sensitive layer ($R_{dn}$) is determined in the same manner except that the negative-acting, light-sensitive layer is exposed to sufficient actinic radiation to convert the exposed area into a powder-receptive state.

Although the $R_d$ of all light-sensitive layers is determined by using the aforesaid black developing powder and a white substrate, the $R_d$ is only a measure of the suitability of a light-sensitive layer for use in this invention.

Since the $R_d$ of any light-sensitive layer is dependent on numerous factors other than the chemical constitution of the light-sensitive layer, the light-sensitive layer is best defined in terms of its $R_d$ under the development conditions of intended use. The positive-acting, solid, light-sensitive organic layers useful in this invention must be powder receptive in the sense that the aforesaid black developing powder can be embedded as a monoparticle layer into a stratum at the surface of the unexposed layer to yield a $R_{dp}$ of 1.0 to 2.2 under the predetermined conditions of development and light-sensitive in the sense that upon exposure to actinic radiation the most exposed areas can be converted into the non-particle receptive state (background cleared) under the predetermined conditions of development. In other words, the positive-acting, light-sensitive layer must contain a certain inherent powder receptivity and light-sensitivity. The positive-acting, light-sensitive layers are apparently converted into the powder-non-receptive state by a light-catalyzed hardening action, such as photopolymerization, photocrosslinking, photooxidation, etc. Some of these photohardening reactions are dependent on the presence of oxygen, such as the photooxidation of internally ethylenically unsaturated acids and esters while others are inhibited by the presence of oxygen, such as those based on the photopolymerization of the vinylidene groups of polyvinylidene monomers alone or together with polymeric materials. The latter require special precautions, such as storage in oxygen-free atmosphere or oxygen-impermeable cover sheets. For this reason, it is preferable to use solid, positive-acting, film-forming, organic materials containing no terminal ethylenic unsaturation.

The negative-acting, solid, light-sensitive organic layers useful in this invention must be light-sensitive in the sense that, upon exposure to actinic radiation, the most exposed areas of the light-sensitive layer are converted from a non-powder-receptive state under the predetermined conditions of development to a powder-receptive state under the predetermined conditions of development. In other words, the negative-acting, light-sensitive layer must have a certain minimum light-sensitivity and potential powder receptivity. The negative-acting, light-sensitive layers are apparently converted into the powder receptive state by a light-catalyzed softening action, such as photodepolymerization.

In general, the positive-acting, solid, light-sensitive layers useful in this invention comprise a film-forming organic material in its naturally occurring or manufactured form or a mixture of said organic material with plasticizers and/or photoactivators for adjusting powder receptivity and sensitivity to actinic radiation. Suitable positive-acting, film-forming organic materials which are not inhibited by oxygen, include internally ethylenically unsaturated acids, such as abietic acid, rosin acids, partially hydrogenated rosin acids, such as those sold under the name Staybelite resin, wood rosin, etc., esters of internally ethylenically unsaturated acids, methylol amides of maleated oils such as described in U.S. Pat. 3,471,466, phosphatides of the class described in application Ser. No. 796,841, now abandoned, filed on Feb. 5, 1969 in the name of Hayes, such as soybean lecithin, partially hydrogenated lecithin, dilinolenyl-alpha-lecithin, etc., partially hydrogenated rosin acid esters, such as those sold under the name Staybelite esters, rosin modified alkyds, etc.; polymers of ethylenically unsaturated monomers, such as vinyltoluene-alpha methyl styrene copolymers, polyvinyl cinnamate, polyethyl methacrylate, vinyl acetate-vinyl stearate copolymers, polyvinyl pyrrolidone, etc.; coal tar resins, such as coumarone-indene resins, etc.; halogenated hydrocarbons, such as chlorinated waxes, chlorinated polyethylene, etc. Positive-acting, light-sensitive materials, which are inhibited by oxygen include mixtures of polymers, such as polyethylene terephthalate/sebacate, or cellulose acetate or acetate/butyrate, with polyunsaturated vinylidene monomers, such as ethylene glycol diacrylate or dimethacrylate, tetraethylene glycol diacrylate of dimethacrylate, etc.

Although numerous positive-acting, film-forming organic materials have the requisite light-sensitivity and powder receptivity at predetermined development temperatures, it is generally preferable to compound the film-forming organic material with photoactivator(s) and/or plasticizers(s) to impart optimum powder-receptivity and light-sensitivity to the light-sensitive layer. In most cases, the light-sensitivity of an element can be increased many fold by incorporation of a suitable photoactivator capable of producing free-radicals, which catalyze the light-sensitive reaction and reduce the amount of photons necessary to yield the desired physical change.

Suitable photoactivators capable of producing free-radicals include benzil, benzoin, Michlers ketone, diacetyl, phenanthraquinone, p-dimethylaminobenzoin, 7,8-benzoflavone, trinitrofluorenone, desoxybenzoin, 2,3-pentanedione, dibenzylketone, nitroisatin, di(6-dimethylamino-3-pyradil) methane, metal naphthanates, N-methyl-N-phenylbenzylamine, pyridil, 5-7 dichloroisatin, azodiisobutyronitrile, trinitroanisole, chlorophyll, isatin, bromoisatin, etc. These compounds can be used in a concentration of .001 to 2 times the weight of the film-forming organic material (.1%–200% the weight of the film former). As in most catalytic systems, the best photoactivator and optimum concentration thereof is dependent upon the film-forming organic material. Some photoactivators respond better with one type of film former and may be useful over rather narrow concentration ranges whereas others are useful with substantially all film-formers in wide concentration ranges.

The acryloin and vicinal diketone photoactivators, particularly benzil and benzoin are preferred. Benzoin and benzil are effective over wide concentration ranges with substantially all film-forming light-sensitive organic materials. Benzoin and benzil have the additional advantage that they have a plasticizing or softening effect on film-forming light-sensitive layers, thereby increasing the powder receptivity of the light-sensitive layers. When employed as a photoactivator, benzil should preferably comprise at least 1% by weight of the film-forming organic material (.01 times the film former weight).

Dyes, optical brighteners and light absorbers can be used alone or preferably in conjunction with the aforesaid free-radical producing photoactivators (primary photoactivators) to increase the light-sensitivity of the light-sensitive layers of this invention by converting light rays into light rays of longer lengths. For convenience, these secondary photoactivators (dyes, optical brighteners and light absorbers) are called "superphotoactivators." Suitable dyes, optical brighteners and light absorbers include 4-methyl-7-dimethylaminocoumarin, Calcofluor yellow HEB (preparation described in U.S. Pat. 2,415,-373), Calcofluor white SB super 30080, Calcofluor, Uvitex W conc., Uvitex TXS conc., Uvitex RS (described in Textil-Rundschau 8 [1953], 339), Uvitex WGS conc., Uvitex K, Uvitex CF conc., Uvitex W (described in Textil-Rundschau 8, [1953], 340), Aclarat 8678, Blancophor OS, Tenopol UNPL, MDAC S–8844, Uvinul 400, Thilflavin TGN conc., Aniline yellow-S (low conc.), Seto flavine T 5506–140, Auramine O, Calcozine yellow OX, Calcofluor RW, Calcofluor GAC, Acetosol yellow 2 RLS-PHF, Eosine bluish, Chinoline yellow-P conc., Ceniline yellow S (high conc.), Anthracene blue Violet fluorescence, Calcofluor white MR, Tenopol PCR, Uvitex GS, Acid-yellow -T-supra, Acetosol yellow 5 GLS, Calcocid OR, Y, Ex. Conc., diphenyl brilliant flavine 7 GFS, Resoflorm fluorescent yellow 3 CPI, Eosin yellowish, Thiazole fluorescor G, Pyrazalone organe YB–3, and National FD&C yellow. Individual superphotoactivators may respond better with one type of light-sensitive organic film-former and photoactivator than with others. Further, some photoactivators function better with certain classes of brighteners, dyes and light absorbers. For the most part, the most advantageous combinations of these materials and proportions can be determined by simple experimentation.

As indicated above, plasticizers can be used to impart optimum powder receptivity to the light-sensitive layer. With the exception of lecithin, most of the film-forming, light-sensitive organic materials useful in this invention are not powder-receptive at room temperature but are powder-receptive above room temperature. Accordingly, it is desirable to add sufficient plasticizer to impart room temperature (15 to 30° C.) or ambient temperature powder receptivity to the light-sensitive layers and/or broaden the $R_{dp}$ range of the light-sensitive layers.

While various softening agents, such as dimethyl siloxanes, dimethyl phthalate, glycerol, vegetable oils, etc. can be used as plasticizers, benzil and benzoin are preferred since, as pointed out above, these materials have the additional advantage that they increase the light-sensitivity of the film-forming organic materials. As plasticizer-photoactivators, benzoin and benzil are preferably used in a concentration of 10% to 80% by weight of the film-forming solid organic material.

The preferred positive-acting, light-sensitive film formers containing no conjugated terminal ethylenic unsaturation include the esters and acids of internally ethylenically unsaturated acids, particularly the phosphatides, rosin acids, partially hydrogenated rosin acids and the partially hydrogenated rosin esters. These materials, when compounded with suitable photoactivators, preferably acyloins or vicinal diketones together with superphotoactivators are relatively fast and can be developed to yield water-insoluble powder resist patterns having the desired configuration.

In general, the negative-acting, light-sensitive layers useful in this invention comprise a film-forming organic material in its naturally occurring or manufactured form, or a mixture of said organic material with plasticizers and/or photoactivators for adjusting powder receptivity and sensitivity to actinic radiation. Suitable negative-acting, film-forming organic materials include n-benzyl linoleamide, dilinoleyl-alpha-lecithin, castor wax (glycerol 12-hydroxy-stearate), ethylene glycol monohydroxy stearate, polyisobutylene, polyvinyl stearate, etc. Of these, castor wax and other hydrogenated ricinoleic acid esters (hydroxystearate) are preferred. These materials can be compounded with plasticizers and/or photoactivators in the same manner as the positive-acting, light-sensitive, film-forming organic materials.

In somewhat greater detail, water-insoluble image areas are produced by applying a thin layer of solid, light-sensitive, film-forming organic material having a potential $R_d$ of 1.0 to 2.2 (i.e. capable of developing a $R_{dp}$ or $R_{dn}$ of 1.0 to 2.2) to a hydrophilic metal base, preferably a grained metal substrate, by any suitable means dictated by the nature of the film-formnig organic material and/or the base (hot melt, draw down, spray, roller coating or air knife, flow, dip, curtain coating, etc.) so as to produce a reasonably smooth homogeneous layer of from 0.1 to 10 microns thick employing suitable solvents as necessary. Suitable hydrophilic metal bases for use in this invention comprise grained aluminum, zinc, steel, etc.

The light-sensitive layer must have an average thickness of at least 0.1 micron thick, and preferably at least 0.4 micron, in order to hold water-insoluble powders during development. If the light-sensitive layer is less than 0.1 micron, or the powder diameter is more than 25 times layer thickness, the light-sensitive layer does not hold the powder with the necessary tenacity. In general, as layer thickness increases, the light-sensitive layer is capable of holding larger particles. However, as the light-sensitive layer thickness increases, it becomes increasingly difficult to maintain film integrity during development. Since grained metal plates are preferred, the light-sensitive layer may vary from somewhat less than 0.1 micron in the high spots of the plate to somewhat more than 10 microns in the low spots. In any event the light-sensitive layer should have an average thickness between 0.1 and 10 microns.

The light-sensitive layers of predetermined thickness are preferably applied to the base from an organic solvent (hydrocarbon, such as hexane, heptane, benzene, etc.; halogenated hydrocarbon, such as chloroform, carbon tetrachloride, 1,1,1-trichloroethane, trichloroethylene, etc.). If desired, the light-sensitive layers can be deposited from suitable aqueous emulsions. The thickness of the light-sensitive layer can be varied as a function of the concentration of the solids dissolved in the solvent.

After the metal base is coated with a suitable solid, light-sensitive organic layer, a latent image is formed by exposing the element to actinic radiation in image-receiving manner in predetermined areas corresponding to an optical pattern for a time sufficient to provide a potential $R_d$ of 1.0 to 2.2. The light-sensitive elements can be exposed to actinic light through a continuous tone, half-tone or line image.

As indicated above, the latent images are preferably produced from positive-acting, light-sensitive layers by exposing the element in image-receiving manner for a time sufficient to clear the background, i.e. render the exposed areas non-powder-receptive. As explained in commonly assigned application Ser. No. 796,897, now abandoned, which is incorporated by reference, the amount of actinic radiation necessary to clear the background varies to some extent with developer size and development conditions. Due to these variations it is often desirable to slightly overexpose both positive and negative-acting, light-sensitive elements.

After the light-sensitive element is exposed to actinic radiation for a time sufficient to clear the background of the positive-acting, light-sensitive layer or establish a potential $R_{dn}$ of 1.0 to 2.2, a water-insoluble resin powder is applied to the light-sensitive layer. The developing powder, which has a diameter or dimension along one axis of at least 0.3 micron, is applied physically with a suitable force, preferably mechanically, to embed the powder in the light-sensitive layer. The developing powder can be virtually any shape, such as spherical, acicular, platelets, etc. provided it has a diameter along at least one axis of at least 0.3 micron.

Suitable water-insoluble, organic solvent soluble resinous powders include Vinylite VMCH (vinyl chloride-vinyl acetate-maleic anhydride), phenol-formaldehyde resins, epoxy resins, polyamide (nylon) resins, polystyrene resins, acrylic resins, vinyl toluene-butadiene resins, etc. If desired these resinous powders can be pigmented.

The black developing powder for determining the $R_d$ of a light-sensitive layer, which can also be employed as a suitable light-absorbing pigment in this invention is formed by heating about 77% Pliolite VTL (vinyltoluene-butadiene copolymer) and 23% Neo Spectra carbon black at a temperature above the melting point of the resinous carrier, blending on a rubber mill for fifteen minutes and then grinding in a Mikro-atomizer.

The developing powders useful in this invention contain particles having a diameter or dimension along at least one axis from 0.3 to 25 microns, preferably 0.5 to 10 microns, with powders of the order of 1 to 15 microns being best for light-sensitive layers of 0.4 to 10 microns. Maximum particle size is dependent on the thickness of the light-sensitive layer while minimum particle size is independent of layer thickness. Electron microscope studies have shown that powders having a diameter 25 times the thickness of the light-sensitive layer cannot be permanently embedded into light-sensitive layers, and generally speaking, best results are obtained where the diameter of the powder particle is less than about 10 times the thickness of the light-sensitive layer. For the most part, particles over 25 microns are not detrimental to image development provided the developing powder contains a reasonable concentration of powder particles under 25 microns, which are less than 25 times, and preferably less than 10 times, the light-sensitive layer thickness.

Although developing powders over 25 microns are not detrimental to image development, the presence of particles under 0.3 micron diameter along all axes can be detrimental. In general, it is preferable to employ developing powders having substantially all powders having a diameter along at least one axis not less than 0.3 micron, preferably more than 0.5 micron, since particles less than 0.3 micron tend to embed in non-image areas. As the particle size of the smallest powder in the developer increases, less exposure to actinic radiation is required to clear the background.

For best results, the developing powder should have substantially all particles (at least 95% by weight) over 1 micron in diameter along one axis and preferably from 1 to 15 microns for use with light-sensitive layers having an average thickness of from 0.4 to 10 microns. In this way, powder embedment in image areas is maximum.

In somewhat greater detail, the developing powder is applied directly to the light-sensitive layer, while the powder receptive areas of said layer are in at most only a slightly soft condition and said layer is at a temperature below the melting point of the layer and powder. The powder is distributed over the area to be developed and physically embedded into the stratum at the surface of the light-sensitive layer, preferably mechanically by force having a lateral component, such as to-and-fro and/or circular rubbing or scrubbing action using a soft pad, fine brush, etc. If desired, the powder may be applied separately or contained in the pad or brush. The quantity of powder is not critical provided there is an excess available beyond that required for full development of the area, as the development seems to depend primarily on particle-to-particle interaction rather than brush-to-surface or pad-to-surface forces to embed a layer of powder particles substantially one particle thick (monoparticle layer) into a stratum at the surface of the light-sensitive layer. Only a single stratum of powder particles penetrates into the powder-receptive areas of the light-sensitive layer even if the light-sensitive layer is several times thicker than the developer particle diameter.

The pad or brush used for development is critical only to the extent that it should not be so stiff as to scratch or scar the film surface when used with moderate pressure with the preferred amount of powder to develop the film. Ordinary absorbent cotton loosely compressed into a pad about the size of a baseball and weighing about 3 to 6 grams is especially suitable. The developing motion and force applied to the pad during development is not critical. The speed of the swabbing action is not critical other than that it affects the time required; rapid movement requiring less time than slow. The preferred mechanical action involved is essentially the lateral action applied in ultrafine finishing of a wood surface by hand sanding or steel wooling.

Hand swabbing is entirely satisfactory, and when performed under the conditions described above, will reproducibly produce the maximum density which the material is capable of achieving. That is, the maximum concentration of particles per unit area will be deposited under the prescribed conditions, dependent upon the physical properties of the material such as softness, resiliency, plasticity, and cohesivity. Substantially the same results can be achieved using a mechanical device for the powder application. A rotating or rotating and oscillating, cylindrical brush or pad may be used to provide the described brushing action and will produce a substantially similar end result.

After the application of developing powder, excess powder remains on the surface which has not been sufficiently embedded into, or attached to, the base. This may be removed in any convenient way, as by wiping with a clean pad or brush usually using somewhat more force than employed in mechanical development, by vacuuming, by vibrating, by air doctoring, by air jets, etc., and recovered. For simplicity and uniformity of results, the excess powder usually is blown off using an air gun having an air-line pressure of about 20 to 40 p.s.i. The gun is preferably held at an angle of about 30 to 60 degrees to the surface at a distance of 1 to 12 inches (3 to 8 preferred). The pressure at which the air impinges on the surface is about 0.1 to 3, and preferably about 0.25 to 2, pounds per square inch. Air cleaning may be applied for several seconds or more until no additional loosely held particles are removed. The remaining powder should be sufficiently adherent to resist removal by moderately forceful wiping or other reasonably abrasive action.

The water-insoluble powder image can be converted into a resist or stencil suitable for use in the etching step by one of two techniques. On the one hand, the water-insoluble developing powder particles can be fused to the surface of the metal substrate by heat (preferably at about 250 to 500° F.) and the residual light-sensitive material remaining in the non-image areas (exposed areas of positive-acting light-sensitive layers and unexposed areas of negative-acting light-sensitive layers) removed during the etching of the metal substrate. On the other hand, the water-insoluble powder particles can be either fused or sintered to the surface of the metal substrate using either heat or solvent vapors. In this case, the residual light-sensitive material remaining in the non-image areas is removed with a solvent, which is a poor solvent for the remaining (fused or sintered) water-insoluble powder image. If the water-insoluble developing powder was merely sintered by heat or solvent vapors or fused with solvent vapors, it is necessary to heat fuse the powder particles of the metal substrate to form the resist or stencil for the etching step. If the water-insoluble resist had been fused by heat prior to the removal of the light-sensitive layer from the non-image areas, it may be desirable to refuse the powder particles with heat in order to remove any occluded solvent from the powder particles thereby enhancing the resistance of the stencil to the etchant.

The hydrophilic metal substrate bearing the water-insoluble resist is then treated with an appropriate aqueous etchant well known to those in the deep etch printing plate art, such as any of the commercial deep etch solutions. For example, aqueous ferric chloride or mild caustic can be used.

The unprotected etched areas of the hydrophilic metal substrate are then converted into the hydrophobic image areas. The plate may be copperized and coated with a non-blinding hydrophobic film former or the non-blinding hydrophobic film former can be applied directly to the plate. It is generally preferred to copperize the plate since this enhances the adhesion of the hydrophobic polymer to the metal surface and increases the run length of the plate. The etched areas of the metal plate can be copperized by conventional means such as by placing the plate in an acidic or alkaline bath containing a cuprous or cupric salt. In either case, the plate bearing the fused resist is coated with a non-blinding, aromatic hydrocarbon-insoluble, hydrophobic film former from a poor solvent for the fused resist. The hydrophobic film former must be aromatic hydrocarbon insoluble since substantially all lithographic inks contain an aromatic hydrocarbon solvent and failure to use an aromatic hydrocarbon insoluble hydrophobic film former will result in loss of hydrophobic areas of the printing plate prematurely. As indicated above, the hydrophobic film former must be applied from a poor solvent for the fused resist in order to prevent the resist from dissolving off prematurely. Suitable hydrophobic film formers include vinyl chloride-vinyl acetate copolymer. Any of the conventional non-blinding lacquers may be employed provided suitable care has been employed in the choice of water-insoluble resist former. In general, the commercial non-blinding hydrophobic lacquers are based on the vinyl chloride-vinyl acetate polymers and are utilizable in this invention. If desirable, any of these polymers may be applied from aqueous emulsion or any suitable polymer having the necessary hydrophobic, hydrocarbon insoluble properties may be employed.

Since the non-blinding hydrophobic film former adheres to both the metal substrate and to the resist, it is necessary to remove the resist and hydrophobic film former adhering thereto in order to produce the finished plate. This can be accomplished readily by using an appropriate solvent for the water-insoluble resist, which is a poor solvent for the hydrophobic film former applied in the preceding step.

As indicated above, a plate can be produced by this process in 15 to 30 minutes as opposed to the prior art method which requires from one to two hours.

The following examples are merely illustrative and should not be construed as limiting the scope of this invention.

EXAMPLE I

A grained aluminum plate was flow coated with a solution comprising 1.7 grams Staybelite Ester #10 (partially hydrogenated rosin ester of glycerol), .51 gram benzil and .255 gram 4-methyl-7-dimethylaminocoumarin, dissolved in 100 mls. Chlorothene (1,1,1-trichloroethane) and air dried. The plate was placed in contact with a negative transparency in a vacuum frame equipped with a mercury vapor point light source, and exposed to light for 2½ minutes. The plate was developed with shellac powder particles of about 1 to 15 microns in diameter using physical force embedding the powder into the unexposed areas and non-embedded powder was removed by blowing with air and wiping with a pad. After the plate was heat fused in an oven at 150° C. for two minutes, the aluminum in the unprotected areas was etched by swabbing with a moderate strength ferric chloride solution, rinsed with water and dried. The etched areas were copperized by placing the plate in a bath containing 75 cc. ethylene glycol, 15 cc. glycerine, 10 cc. isopropanol, 3.2 grams cuprous chloride and 3.2 cc. hydrochloric acid for two minutes. After the plate was washed in water and dried, Vinylite (vinyl chloride-vinyl acetate) deep etch lacquer was applied to the plate and permitted to dry. The stencil and Vinylite lacquer adhering thereto were removed by washing with isopropanol. The plate was then desensitized by treating with acidified gum arabic and was ready to go to press in approximately 20 minutes.

Essentially the same results are obtained by replacing the Staybelite ester composition described above with (1) 1.87 grams Staybelite Ester #5 (partially hydrogenated rosin ester of glycerol), .28 gram benzil and .47 gram 4-methyl-7-dimethylaminocoumarin, dissolved in 100 mls. Chlorothene, (2) 1.87 grams Staybelite resin F (partially hydrogenated rosin acid), .15 gram benzil and .47 gram 4-methyl-7-dimethylaminocoumarin, dissolved in 100 mls. Chlorothene, (3) 1.87 gram wood rosin, .15 gram benzil and .45 gram 4-methyl-7-diethylaminocoumarin, dissolved in 100 mls. Chlorothene, and (4) 1.2 grams Chlorowax 70 LMP, .30 gram benzil and .30 gram 4-methyl-7-dimethylaminocoumarin, dissolved in 100 mls. Chlorothene.

EXAMPLE II

Essentially the same results are obtained when Example I is repeated except that the shellac developing powder is replaced with Pliolite VTL of about 1 to 15 microns in diameter, the Vinylite deep etch lacquer is replaced with a vinyl chloride-vinyl acetate-maleic anhydride copolymer emulsion formed by emulsification of Vinylite VMCH and the pliolite VTL stencil and Vinylite polymer adhering thereto is removed with a mixture of 90 cc. Chlorothene and 10 cc. water.

EXAMPLE III

Example I was repeated with essentially the same results, except that the etched areas were not copperized and the shellac stencil was removed with denatured ethanol.

EXAMPLE IV

When Example I is repeated replacing the positive-acting sensitizer composition with a negative-acting light-sensitive composition comprising 2.25 grams Paracin 15 (ethylene glycol monohydroxy stearate), .3 gram benzil and .3 gram 4-methyl-7-dimethylaminocoumarin dissolved in 100 mls. Chlorothene and a positive transparency is employed, essentially the same results are obtained.

Since many embodiments of this invention may be made and since many changes may be made in the embodiments described, the foregoing is to be interpreted as illustrative only and this invention is defined by the claims appended hereafter.

What is claimed is:

1. The method of forming a deep etch lithographic plate which comprises the steps of:

(1) exposing a hydrophilic metal substrate bearing a light-sensitive layer capable of developing a $R_d$ of 1.0 to 2.2 to actinic radiation to produce a potential $R_d$ of 1.0 to 2.2;
(2) developing said light-sensitive layer with water-insoluble, resinous powder particles using physical force to embed the powder particles in the light-sensitive layer;
(3) removing non-embedded powder particles;
(4) fusing the water-insoluble powder particles to the hydrophilic metal substrate by heating;
(5) etching the hydrophilic metal substrate in the areas unprotected by the fused water-insoluble powder particles;
(6) applying a film forming, aromatic hydrocarbon insoluble, hydrophobic polymer to the plate from a poor solvent for the fused powder particles; and
(7) removing the fused powder particles and hydrophobic polymer adhering thereto with a poor solvent for said hydrophobic polymer.

2. The process of claim 1, wherein the etched areas are copperized in a copperizing bath after step 5 and before step 6.

3. The method of forming a deep etch lithographic plate which comprises the steps of:

(1) exposing a hydrophilic metal substrate bearing a light-sensitive layer capable of developing a $R_{dp}$ of 1.0 to 2.2 to actinic radiation through a negative master to produce a potential $R_{dp}$ of 1.0 to 2.2;
(2) developing said light-sensitive layer with water-insoluble, resinous powder particles using physical force to embed the powder particles as a monolayer in the light-sensitive layer;
(3) removing non-embedded powder particles;
(4) fusing the water-insoluble powder particles to the hydrophilic metal substrate by heating;
(5) etching the hydrophilic metal substrate in the areas unprotected by the fused water-insoluble powder particles;
(6) applying a film forming, aromatic hydrocarbon insoluble, hydrophobic polymer to the plate from a poor solvent for the fused powder particles; and
(7) removing the fused powder particles and hydrophobic polymer adhering thereto with a poor solvent for said hydrophobic polymer.

4. The process of claim 3, wherein the etched areas are copperized in a copperizing bath after step 5 and before step 6.

5. The process of claim 4, wherein said positive-acting, light-sensitive layer comprises a film former selected from the group consisting of internally ethylenically unsaturated acids and internally ethylenically unsaturated acid esters.

6. The process of claim 5, wherein said ethylenically unsaturated acid moiety comprises a rosin acid moiety.

7. The process of claim 5, wherein said light-sensitive layer comprises a photoactivator selected from the group consisting of acyloins and vicinal diketones.

8. The process of claim 4, wherein said hydrophilic metal substrate is aluminum.

9. The method of forming a deep etch lithographic plate which comprises the steps of:

(1) exposing a hydrophilic metal substrate bearing a light-sensitive layer capable of developing a $R_{dn}$ of 1.0 to 2.2 to actinic radiation through a positive master to produce a potential $R_{dn}$ of 1.0 to 2.2;

(2) developing said light-sensitive layer with water-insoluble, resinous powder particles using physical force to embed the powder particles as a monolayer in the light-sensitive layer;

(3) removing non-embedded powder particles;

(4) fusing the water-insoluble powder particles to the hydrophilic metal substrate by heating;

(5) etching the hydrophilic metal substrate in the areas unprotected by the fused water-insoluble powder particles;

(6) applying a film forming, aromatic hydrocarbon insoluble, hydrophobic polymer to the plate from a poor solvent for the fused powder particles; and (7) removing the fused powder particles and hydrophobic polymer adhering thereto with a poor solvent for said hydrophobic polymer.

10. The process of claim 9, wherein the etched areas are copperized in a copperizing bath after step 5 and before step 6.

References Cited

UNITED STATES PATENTS

| | | | |
|---|---|---|---|
| 3,075,866 | 1/1963 | Baker | 96—1 |
| 3,547,627 | 12/1970 | Amidon | 96—1 |
| 3,630,728 | 12/1971 | Tamai | 96—1 |

NORMAN G. TORCHIN, Primary Examiner

J. R. HIGHTOWER, Assistant Examiner

U.S. Cl. X.R.

96—33, 27